United States Patent [19]
Yokomatsu et al.

[11] Patent Number: 4,810,889
[45] Date of Patent: Mar. 7, 1989

[54] FINE CIRCUIT PATTERN DRAWING APPARATUS AND METHOD

[75] Inventors: Takao Yokomatsu, Kawasaki; Hironori Yamamoto, Chigasaki; Mitsuaki Seki, Machida, all of Japan

[73] Assignee: Canon Kabushiki Kaisha, Tokyo, Japan

[21] Appl. No.: 947,035

[22] Filed: Dec. 29, 1986

[30] Foreign Application Priority Data

Dec. 27, 1985 [JP] Japan ................................ 60-297215

[51] Int. Cl.⁴ .............................................. G21K 5/10
[52] U.S. Cl. ............................. 250/492.2; 250/491.1
[58] Field of Search ............. 250/492.2, 492.22, 491.1; 430/313; 356/400; 378/34

[56] References Cited

U.S. PATENT DOCUMENTS

| | | | |
|---|---|---|---|
| 4,325,084 | 4/1982 | van Gorkom et al. | 358/241 |
| 4,489,241 | 12/1984 | Matsuda et al. | 250/491.1 |
| 4,538,069 | 8/1985 | Shambroom et al. | 250/492.2 |
| 4,740,705 | 4/1988 | Crewe | 250/423 R |

Primary Examiner—Carolyn E. Fields
Assistant Examiner—John A. Miller
Attorney, Agent, or Firm—Fitzpatrick, Cella, Harper & Scinto

[57] ABSTRACT

An apparatus for drawing a fine circuit pattern on a wafer, includes a radiation beam generating head for generating and emitting radiation beams with which the wafer is to be patternwisely exposed; a first moving system for moving the beam generating head in a first direction; and a second moving system for moving the wafer at least in a second direction, substantially perpendicular to the first direction, while holding the wafer by attraction.

10 Claims, 6 Drawing Sheets

FINE CIRCUIT PATTERN DRAWING APPARATUS AND METHOD

FIELD OF THE INVENTION AND RELATED ART

This invention relates to an apparatus and method for forming a fine circuit pattern or patterns on a workpiece such as typically a semiconductor wafer. More particularly, the invention is concerned with an apparatus and method for directly drawing such pattern or patterns on a workpiece without use of any mask having a corresponding circuit pattern.

In the field of manufacture of semiconductor devices such as integrated circuits, electron-beam patterns generators are used to directly form or draw circuit patterns on a semiconductor wafer. This type of pattern drawing apparatus uses a single electron-beam generating source, and therefore a relatively long time is required for the "patternwise exposure" of one wafer with the electron beams. Also, a wafer stage which is included to carry and move the wafer has a multi-stage structure comprising an X-axis moving mechanism, a Y-axis moving mechanism, a θ-direction (rotational direction) moving mechanism and a Z-axis moving mechanism. This necessarily results in bulkiness of the apparatus.

SUMMARY OF THE INVENTION

It is accordingly a primary object of the present invention to provide a fine circuit pattern drawing apparatus and method by which circuit patterns can be drawn on a workpiece in reduced exposure time.

It is another object of the present invention to provide a fine circuit pattern drawing apparatus which allows high-speed exposure of a workpiece with a simple and compact structure.

Briefly, according to one aspect of the present invention, there is provided an apparatus for drawing a fine circuit pattern on a wafer, said apparatus comprising:

a radiation beam generating head for generating and emitting radiation beams with which the wafer is to be exposed to form a pattern thereon;

first moving means for moving said beam generating head in a first direction; and second moving means for moving the wafer at least in a second direction, substantially perpendicular to said first direction, while holding the wafer by attraction.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
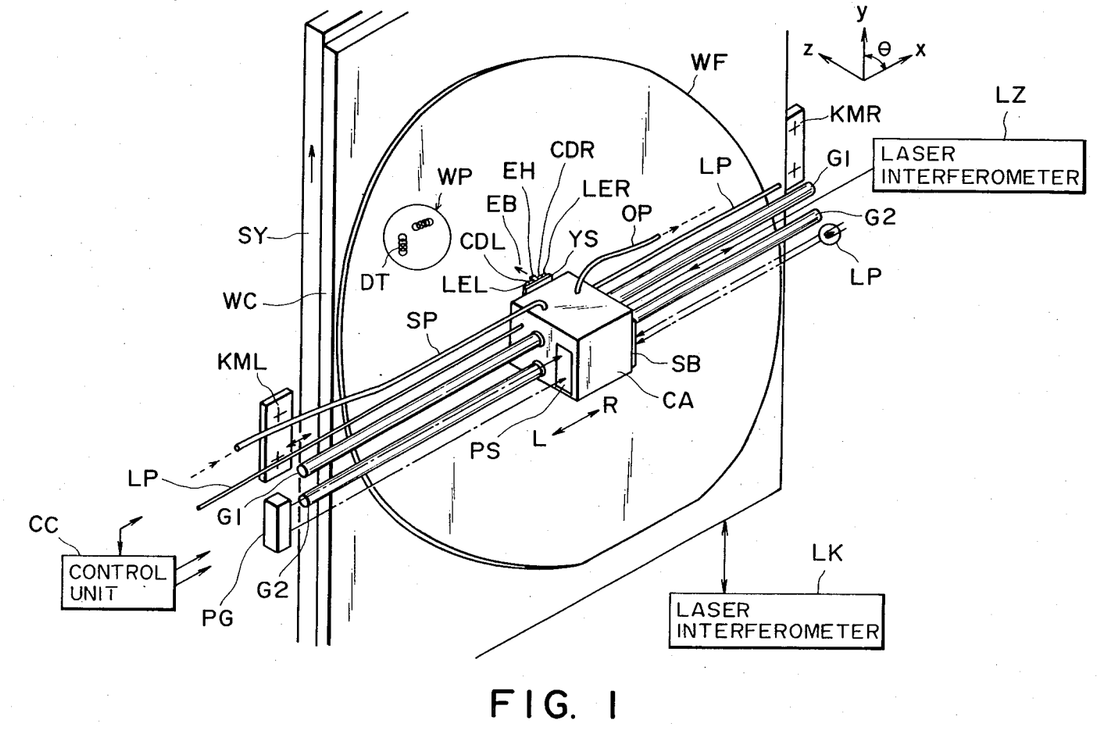
FIG. 1 is a perspective view schematically and diagrammatically showing a major portion of a pattern drawing apparatus according to an embodiment of the present invention.

Referring first to FIG. 1, there is shown a major portion of a fine circuit pattern drawing apparatus according to an embodiment of the present invention. The apparatus includes a wafer chuck WC for attractingly holding a wafer WF which is made of a semiconductive material such as silicon. The wafer chuck WC is made movable upwardly and downwardly in a Y-axis direction, while carrying thereon the wafer WF. In this preferred embodiment, the wafer chuck WC used is of the type which is called an "electrostatic chuck" in view of the fact that the drawing apparatus is often operated in vacuum environment. The electrostatic type wafer chuck WC is fixedly mounted on a table SY which is called "Y-stage", such that the wafer chuck WC is adapted for fine and intermittent movement in the Y-axis direction by means of this Y-stage. The Y-axis feeding of the Y-stage SY and thus the wafer chuck WC is controlled with the aid of a laser interferometer measuring unit LK of known type. A carriage CA is arranged to be moved uninterruptedly in an X-axis direction by means of a wire LP and a driving motor (not shown), while being guided by shafts G1 and G2. The movement of the carriage CA is controlled with the aid of another laser interferometer measuring unit LZ. The carriage CA carries thereon a radiation beam generating head EH which is adapted to generate, at one time, a plurality of radiation beams such as laser beams, electron beams, etc., for exposing the wafer WF to form a pattern thereon. As for such beam generating head EH, assembled light-emitting diodes, assembled semiconductor lasers, a multi-electron-beam generating head as disclosed in U.S. Pat. No. 4,325,084, etc. may be used. In order to assure higher resolution, an assembly of minute and high-density shutter elements comprising liquid-crystal cells may preferably disposed in front of the head EH. By ON/OFF switching of each of the radiation beams, a desired circuit pattern can be drawn on the wafer WF. More particularly, as will be seen from an enlarged portion of the illustration in FIG. 1 as denoted at WP, a plurality of dots DT are "printed" on the wafer through the exposure with radiation beams, these dots being in close proximity to each other or partially overlapped upon one another, thereby to draw a "circuit pattern".

Denoted in FIG. 1 by characters LER and LEL are light sources for illuminating one or more alignment marks and/or one or more actual element patterns formed on the wafer. As for these light sources, use is made of light emitting diodes, semiconductor laser devices or the like which are adapted to produce light of a wavelength region with respect to which a resist material applied to the wafer WF surface does not have sensitivity. Imagewise information as obtainable from the light, emitted from these light sources LER and LEL and reflected from the wafer WF surface, is picked up by use of a pair of solid-state area (two-dimensional) photosensor units CDR and CDL each comprising a number of charge-coupled devices, for example. On the basis of the thus detected imagewise information, the attitude or orientation of the beam generating head EH is adjusted, as will be described later in detail.

The carriage CA further carries thereon a solar battery unit SB and a photoreceptor unit PS including a plurality of light-receiving elements. The solar battery unit SB is arranged to receive power supply from a light source LP provided on an unshown main-frame of the apparatus and to drive electronic components accommodated in the carriage CA. On the other hand, the photoreceptor unit PS is arranged to receive various information related to the pattern drawing, from a control unit CC and an exposure pattern generator PG both of which are provided on the mainframe side of the apparatus, in accordance with an optical communication system, and to transmit the same to the head EH. By using such wireless type structure, the carriage CA can be moved very smoothly with substantially constant load, regardless of any change in the moving direction and/or the amount of movement to be made. This is therefore preferable in regard to fine and precise patternwise exposure.

Denoted in FIG. 1 by characters SP and OP are tubes which are provided, respectively, to supply and exhaust a pressure fluid, such as an air pressure, to and from a bearing assembly of the carriage CA. Preferably, these tubes SP and OP are mounted in a symmetrical fashion so as to reduce any change in the load to be applied to the carriage CA.

Denoted by characters KMR and KML are reference (origin) mark plates provided on the main-frame side of the apparatus. In this embodiment, each of the reference mark plates KMR and KML has a pair of reference marks each of which is in the form of a cross and is formed of a reflective material.

Figure 2:
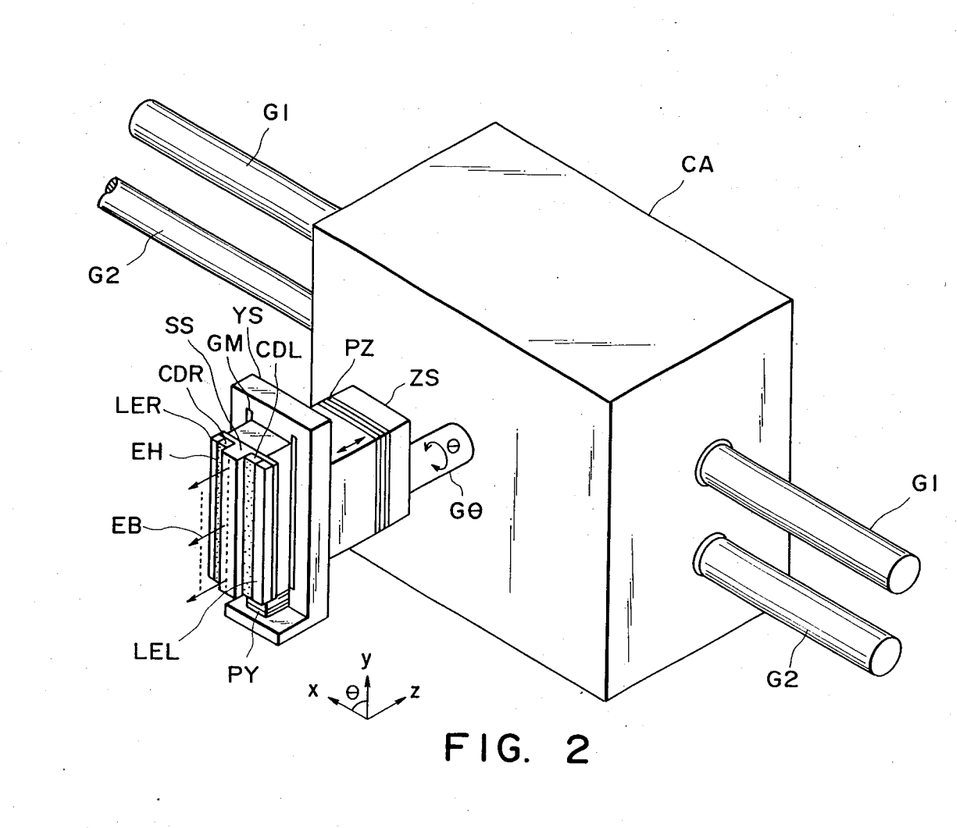
FIG. 2 is a fragmentary enlarged view of a carriage of the FIG. 1 apparatus, as seen from a wafer side.

FIG. 2 is an enlarged view of the carriage CA, as seen from the wafer WF side. As shown in this Figure, the beam generating head EH, the light sources LER and LEL and the photosensor units CDR and CDL are all mounted on a common support member YS. The light sources LER and LEL may be directly secured to the carriage CA. The support member YS has an electrostrictive device PY, such as a piezoelectric device, connected thereto. By actuating the electrostrictive device PY, the support member YS is moved to displace the head EH, the photosensor units CDR and CDL and so on, in the Y-axis direction along guide grooves GM. By this arrangement, the position of the head with respect to the Y-axis direction is adjustable. Denoted at PZ is an electrostrictive device, similar to the device PY, which is mounted on a shaft-like member ZS and is arranged to displace the head in the Z-axis direction thereby to adjust the position of the head with respect to the Z-axis direction. In other words, focus adjustment of the head is attainable.

Shaft Gθ is provided to allow adjustment of the head EH in the θ-direction (rotational direction). The shaft Gθ is rotationally move by means of a driving motor or a fine-driving means such as an electrostrictive device (not shown) which is accommodated in the carriage CA.

The above-described driving elements for adjusting the position and/or the orientation of the head EH are operable, before initiation of or during the movement of the carriage CA, in response to reception of the imagewise information related to any pattern on the wafer WF by the photosensor units such as at CDR and CDL. As is best seen in FIG. 2, the apparatus is provided with a pair of such photosensor units as denoted at CDR and CDL which are disposed on the opposite sides of the head EH. In this embodiment, the photosensor unit CDR, which is on the right-hand side as viewed in FIG. 1, is used where the carriage CA is to be moved or being moved rightwardly to execute the patternwise exposure (pattern drawing) in a "forward" order. On the other hand, the left-hand side photosensor unit CDL is used where the carriage CA is to be moved or being moved leftwardly to execute the patternwise exposure in a "reverse" order.

The radiation beam generating head EH includes a number of radiation beam generating sources each being adapted to produce and emit a radiation beam EB. These beam generating sources are disposed in an array extending vertically, as is best seen in FIG. 2. The beam generating sources are actuated, under the influence of the control unit CC and the pattern generator PG, to draw a pattern on the wafer. More particularly, where the patternwise exposure is to be executed in the "reverse" order, the pattern generator PG applies the patternwise information signals to the head EH in the reversed order as compared with that in the patternwise exposure in the "forward" order.

Figure 3:
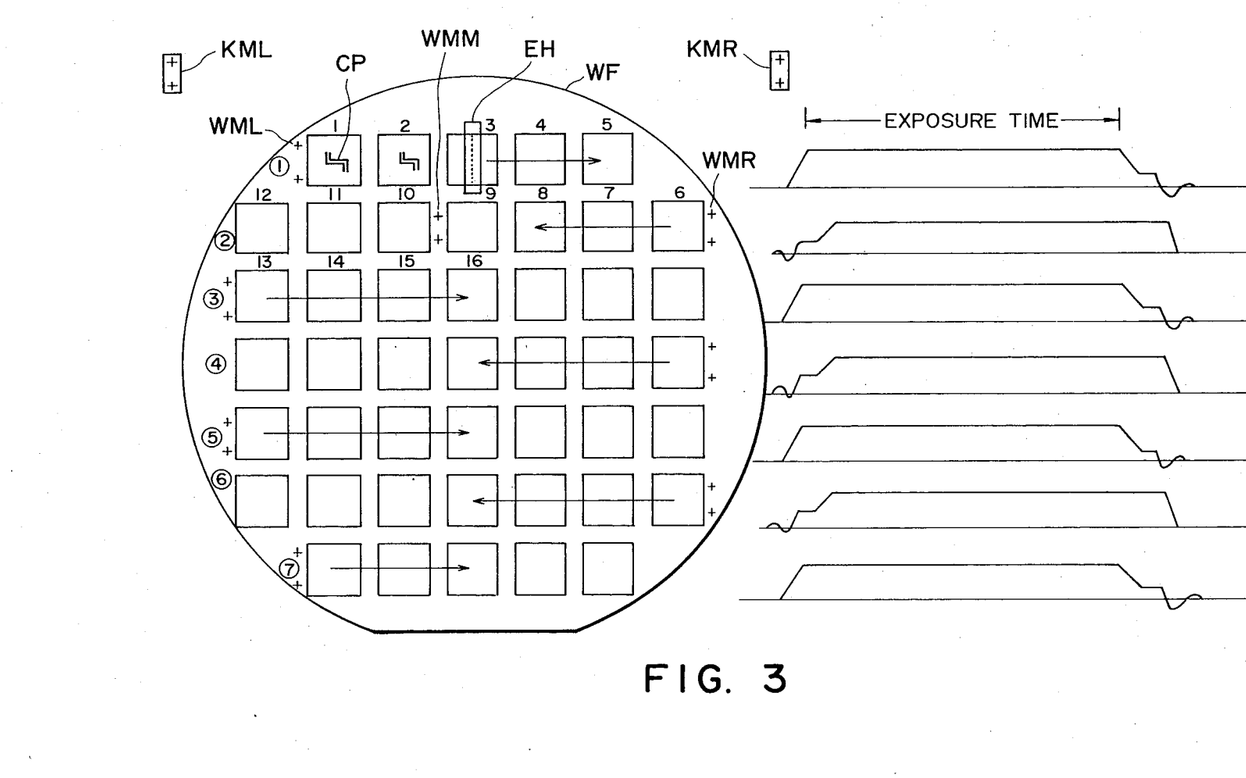
FIG. 3 is a schematic view for explaining an example of the manner of drawing circuit patterns on a wafer, in accordance with the present invention.

Referring now to FIG. 3, there is schematically illustrated an example of layout of shot areas Nos. 1, 2, 3, . . . on the wafer WF in which areas the circuit patterns such as at Cp are to be drawn in the numbered order.

In the initial state, no pattern or mark has yet been "printed" on the wafer WF. Thus, in this state, the wafer WF is an "unexposed wafer" which is called "virgin wafer". To such virgin wafer, the head EH is used to draw thereon alignment marks WM to be used for alignment between the head EH and the wafer WF (in a second-time exposure described later) as well as the circuit patterns CP, in sequence. At first, in this embodiment, the reference marks KML are read by use of the photosensor unit CDL and, in accordance with the result of reading, the orientation of the head EH is adjusted. Thereafter, the head EH starts rightward movement and, during this rightward movement which is uninterruptedly made for the first line ①, patternwise exposures are effected in sequence. As will be understood from the speed curves related to the head EH movement, the head EH is moved under the influence of a servo-controlled system (not shown). During a constant-speed period in the corresponding speed curve, the printing of alignment marks WML as well as the printing of circuit patterns on the shot areas Nos. 1–5 in the first line ① are executed.

When the exposures of the shot areas Nos. 1–5 are completed, the patternwise exposures for the first line ① are finished so that the wafer chuck WC is moved in the Y-axis direction by an amount corresponding to the pitch of the lines. Thus, the apparatus is just prepared for the patternwise exposure of the second line ②, and the shot areas Nos. 6–12 are subjected to pattern drawing in an order from right to left as viewed in FIG. 3. Where it is desired to form a linear pattern by dots which are partially overlapping in the vertical direction such as depicted at DT in FIG. 1, the wafer chuck WC may be moved more finely in the Y-axis direction within the height of one line. This is easily attainable with the aid of the laser interferometer measuring unit LK. The reciprocating scanning of the wafer with uninterrupted movement of the head in each line is very effective to reduce the time necessary for the exposure.

Figure 4:
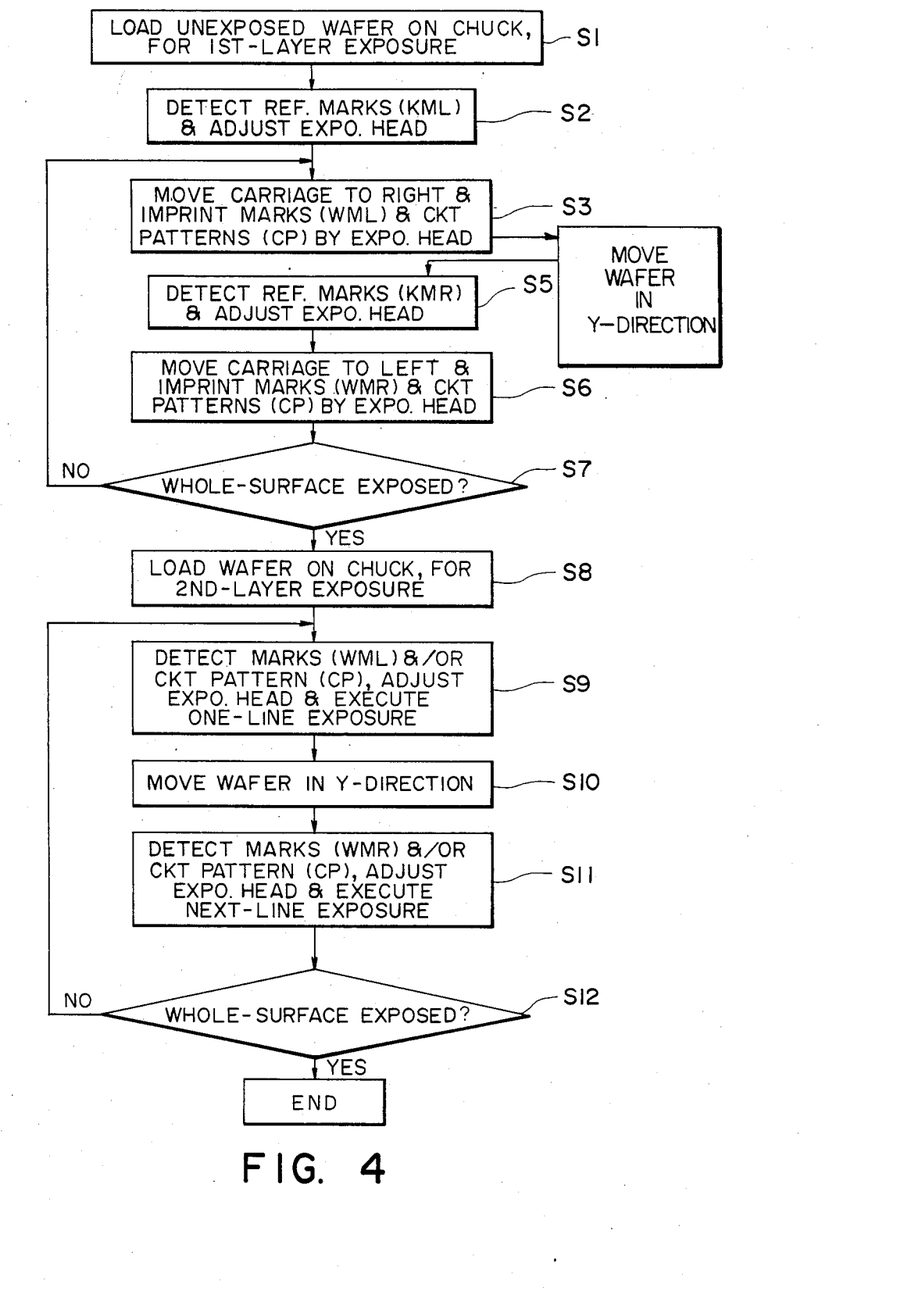
FIG. 4 is a chart of the flow of pattern drawing operations to be executed to draw the patterns on the wafer as in the FIG. 3 example.

Reference will be now made to the flow chart of FIG. 4 in order to describe the aforementioned procedure in more detail. First, at Step S1, an unexposed wafer such as at WF having been prealigned by suitable means of known type is placed on the wafer chuck WC, and the wafer WF is fixedly held by the chuck through electrostatic attraction. Then, at Step S2, the carriage CA is moved to its initial, leftmost end position. Thereafter, the fine alignment of the head EH with respect to the reference marks KML on the main-frame side of the apparatus is carried out. To achieve such fine alignment, the reference marks KML which are in a pair and which are formed of a suitable reflective material are irradiated with light from the left-hand side light source LEL. The light reflected from the reference marks KML is received by the area photosensor unit CDL, whereby the position $(x_1, y_1)$ of each mark in X-Y coordinates is detected. This area photosensor unit CDL has its own reference coordinates $(x_2, y_2)$ that have been stored in a memory of a controller (not shown). Therefore, in response to reception of light reflected from the reference marks, any deviation components "$x_1-x_2$" and "$y_1-y_2$" are detected. The deviation component "$x_1-x_2$" in the X-axis direction can be removed by adjusting the beam emission timing of the head EH during the movement of the carriage CA. The deviation component "$y_1-y_2$" in the Y-axis direction can be removed by displacing upwardly or downwardly the head EH and the photosensor unit CDL by means of the electrostictive device PY shown in FIG. 2. Alternatively, the Y-stage SY may be fed minutely. Since the apparatus is provided with a pair of reference marks in the reference plate KML or KMR, any positional error in the $\theta$-direction (rotational direction) can be calculated in a well-known manner, and it can be corrected by rotationally moving the head EH and the photosensor unit CDL as a unit by means of the shaft G$\theta$.

The focus adjustment, i.e. the position adjustment in the Z-axis direction, is attainable by measuring the extension of light received by the photosensor unit CDL, for example. More specifically, by arranging the light source LEL so as to emit a light beam of shot-like shape in section and by measuring the diameter of the light beam reflected from the wafer WF surface by use of the area photosensor unit, the distance between the head EH and the wafer WF is detectable. Thus, in accordance with the detection, the head EH is displaced by actuating the electrostictive device PZ to a position spaced from the wafer surface by a desired distance. As a matter of course, any one of various types of automatic focusing mechanisms such as, for example, an air-discharging type focusing system, which is well known in the art, may be mounted on the carriage CA. Further, the area photosensor may be replaced by a line (one-dimensiona) photosensor. In such case, substantially the same effect is attainable by moving the carriage. The alignment of the head EH with respect to the wafer is not limited to the concept described hereinbefore, and other positioning principles and mechanisms are usable.

When the fine alignment of the head EH is completed, i.e. upon completion of adjustment of the orientation (or position) of the head EH, the carriage CA starts its movement (Step S3). Then, immediately after the constant speed is reached by the carriage CA, as seen from FIG. 3, the exposure in relation to the first line ①is initiated. First, as seen from the drawing, the alignment marks WML are printed or drawn on the wafer WF by the head EH. Next, the circuit pattern CP is drawn on the shot area No. 1. When the carriage CA is moving while being opposed to a region corresponding to a scribe line lying between two adjacent shot areas, the radiation beams are not emitted from the head EH. When the carriage CA reaches the shot area No. 2, a similar circuit pattern CP is printed thereon. In this manner, the patternwise exposures of the shot areas in the first line are executed in an order from left to right. When the pattern drawing on the shot area No. 5 is completed, the carriage CA movement is decelerated and, finally, the carriage CA stops at a position of the right-hand side reference marks KMR. Then, at Step S4, the wafer WF is fed by the Y-stage SY in the Y-axis direction by an amount corresponding to the pitch of lines. Such fine feeding of the wafer (Y-stage) is controlled with the aid of the laser interferometer system LK. At the same time, the carriage CA is subjected to an alignment operation (at Step S5 which is similar to Step S2) for aligning the head EH with respect to the pair of right-hand side reference marks KMR. This alignment operation at the rightmost position of the carriage OA is, however, not necessarily indispensable, and may be omitted as desired.

Subsequently, at Step S6, alignment marks WMR are drawn on the wafer WF. Then, a circuit pattern CP is drawn in the shot area No. 6. It will be readily understood that this pattern drawing is executed in a reversed order as compared with the order of pattern drawing at Step S3. Thereafter, while moving the carriage CA from right to left, patternwise exposures of the shot areas Nos. 7-12 in the second line ② are executed in a similar manner.

Upon completion of exposure in regard to the second line ②, the sequence goes back to Step S3 and the above-described operations are repeated with the reciprocating movement of the carriage, until all the shot areas on the wafer WF are exposed.

The second-time exposure of the same wafer WF, more specifically the exposure of a second layer of the wafer WF, starts at Step S8. That is, the wafer WF is placed again on the wafer chuck WC, and the orientation of the head EH is adjusted at step S9 in a similar manner as in Step S2. It is however to be noted that the reference with respect to which the head EH is to be relatively aligned in step S9 differs from that in Step S2. Namely, at Step S9, the head EH is relatively moved so as to be aligned with the pair of wafer alignment marks WML, rather than the reference marks KML, which alignment marks have been formed on the wafer WF by the first-time exposure described hereinbefore. Except for this point, the position detection with the photosensor unit CDL and the position adjustment of the head EH are executed essentially in the same way as in Step S2. At this time, any one of the circuit patterns already printed on the water may be used as an "alignment mark" in combination with the marks WML. Also, it is possible to use such circuit pattern only, for the fine alignment of the head EH.

After completion of the alignment of the head EH with the alignment marks WML, second circuit patterns are drawn sumperimposingly upon the circuit patterns having been formed by the first-time exposure. This is achieved similarly with the uninterrupted movement of the carriage, as in the first-time exposure. After completion of the exposure of the shot areas in the first line ①, the wafer WF is moved at Step S10 by an amount corresponding to the pitch of lines, as described in the foregoing. At the same time or shortly thereafter, the alignment of the head EH with the alignment marks WMR on the wafer WF is executed at Step S11, in a similar manner as has been described. Then, the carriage CA is moved uninterruptedly from right to left and, during this movement, the patternwise information is outputted from the pattern generator to the head EH in a reverse order as compared with the case of exposure in relation to the first line ①. In this manner, the exposure for the second line ② is achieved. And, similar operations are repeated so that the second-time exposure of the wfer WF is completed.

It is a possible alternative that the orientation of the head is adjusted by use of the photosensor units CDL and CDR during the movement of the carriage CA. More particularly, when the carriage CA is moving rightwardly, the right-hand photosensor unit CDR may be used, whereas the left-hand photosensor unit CDL may be used when the carriage CA is moving leftwardly. In any case, the photosensor unit CDR or CDL can detect any circuit pattern on the wafer or one or more intermediate alignment marks such as at WMM in FIG. 3 formed on the wafer. On the basis of the detection, the position or orientation of the head EH is adjustable during the movement of the carriage CA by use of appropriate one or ones of the driving elements PY, PZ, G$\theta$, etc.

The provision of a pair of photosensor units such as at CDR and CDL is not necessarily indispensable. One of them may be omitted as desired. Also, it is not always necessary to adjust the position of the head in the three directions, i.e. the Y-axis direction, the Z-axis direction and the $\theta$-direction, by use of corresponding fine-adjustment driving elements PY, PZ and G$\theta$. One or two of them may be omitted as desired.

With regard to the position adjustment of the head in the X-axis direction, substantially the same effect is advantageously attainable only by changing the beam emission timing, as described hereinbefore. Such timing control can be easily achieved in accordance with a well-known controlling technique. As for the radiation beam, any one of various types of radiation beams is usable, provided that a resist material used shows sufficient sensitivity to the beam.

Where the head has a base which is made of a semiconductive material, as in the present embodiment, the solid state photosensor units CDL and CDR, the solid state light sources LEL and LER and so on may be provided commonly on a single silicon substrate. Therefore, the setting of the positional relation, e.g., between the head and the photosensor can be very easily and precisely attained. This is very advantageous.

Mounting the radiation beam generating head on a movable carriage allows substantial reduction in size and weight of the apparatus because it is necessary to move a wafer carrying stage in on direction (Y-axis direction) only. This is very advantageous since, in this type of apparatus, reduction in size has been particularly desired in the point of regulation of the pressure, retaining vacuum and assuring cleanliness all in a chamber in which the exposure apparatus is accommodated. With the conventional multi-stage type structure, the reduction in size of the apparatus is not attainable without difficulties. In accordance with the present invention, the exposure head itself is made movable in the X-axis direction and/or in each of the Y-axis direction, Z-axis direction and $\theta$-direction. Also, the wafer is made movable by the Y-axis moving stage. Thus, the driving or moving mechanisms are made discrete which allows substantial reduction in size and height of the apparatus. As a matter of course, however, the conventional multi-stage structure may be used with the head driving mechanism, as desired.

Figure 5:
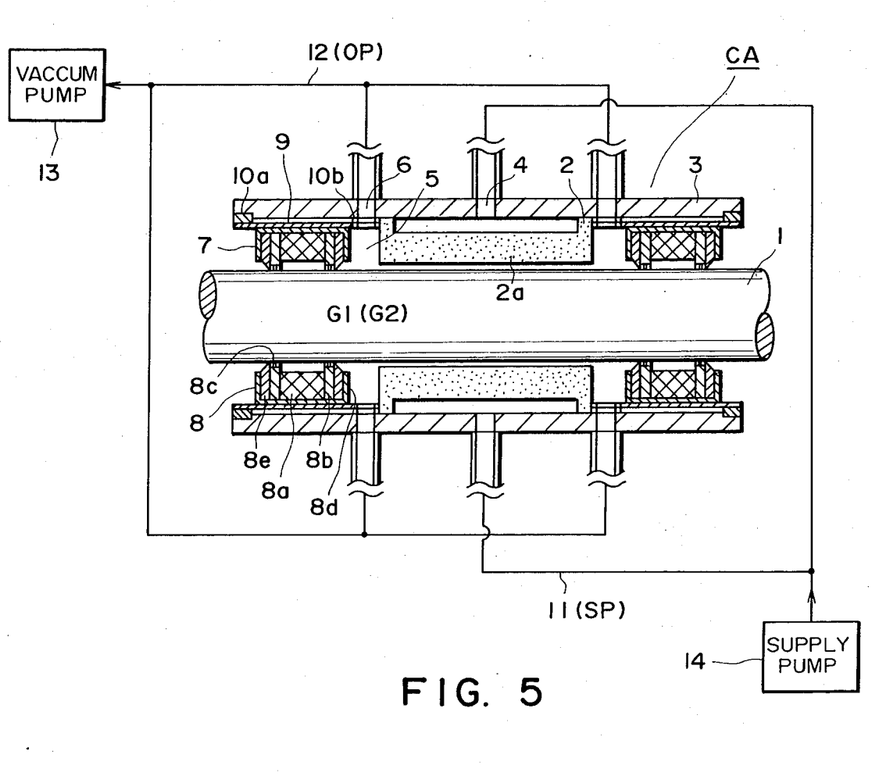
FIG. 5 is a sectional view schematically and diagrammatically showing a bearing assembly included in the apparatus of FIG. 1.
Figure 6:
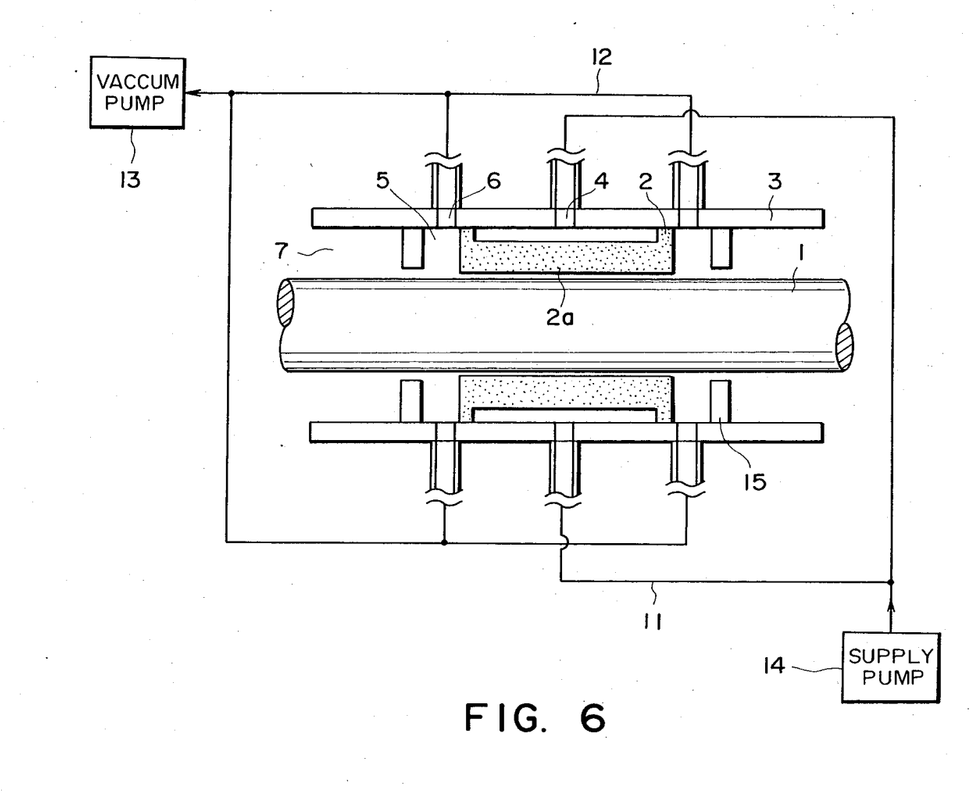
FIG. 6 is a view similar to FIG. 5, but shows a modified form of the bearing assembly.

In this embodiment, the wafer is held by the chuck in a plane extending substantially vertically. More particularly, it is loaded on the chuck from below and is discharged upwardly. Thus, the possibility of accumulation of dust or foreign particles on the wafer is significantly decreased. Also, the space necessary for conveying the wafer can be made compact. This lead to reduction in time necessary for processing one wafer. Although it is not always necessary to use the apparatus in a vacuum chamber, preferred forms of the bearing assembly for the movable carriage where the apparatus is to be operated in the vacuum chamber are illustrated in FIGS. 5 and 6. The concept of the FIGS. 5 and 6 embodiments can be utilized at any interface or boundary, in the exposure apparatus, between the vacuum and the atmospheric pressure.

Referring first to FIG. 5, there is shown a first example of the bearing assembly. A columnar shaft 1 extends horizontally as viewed in this Figure. A fluid discharging portion or pad 2 has a generally cylindrical shape and is made of a porous material. The fluid discharging portion 2 encircles a portion of the shaft 1, as seen from FIG. 5. The fluid discharging portion 2 has an inner cylindrical bearing surface 2a and annular side surfaces. The side surfaces of the discharging portion 2 are coated with a suitable material to prevent gas leakage therefrom. A cylindrical housing 3 extends coaxially with the shaft 1 and accommodates therein various components of the bearing assembly. The housing member 3 has a plurality of air-pressure supplying ports 4 and a plurality of exhaust ports 6. Air reservoir spaces 5 are defined within the housing member 3 and at opposite sides of the fluid discharging portion 2. The air discharged from the bearing surface 2a of the fluid discharging portion 2 is pumped into these spaces 5. Air-pressure supplying passages 11 provide fluid communication between an air-pressure supplying pump 14 and the air-supplying ports 4, so that the air-pressure produced by the pump 14 is supplied to the fluid discharging portion 2 by way of the ports 4. On the other hand, exhaust passages 12 provide fluid communication between a suction pump 13 and the exhaust ports 6, so that the air within the housing member 3 is drawn via the ports 6 to the pump 13. The shaft 1 and the components of the bearing device including the housing member 3 and those accommodated within the housing member 3 are all disposed in a vacuum chamber (not shown), while the two pumps 13 and 14 are placed outside the vacuum chamber.

The air (air-pressure which is supplied from the outside of the vacuum chamber, i.e. from the outside of a high-vacuum environment 7) to the air supplying ports 4 by means of the air supplying pump 14 is discharged from the bearing surface 2a of the fluid discharging portion 2 to the surface of the shaft 1. By this, a lubricating film is formed between the bearing surface 2a and the surface of the shaft 1. The air thus forming the lubricating film then flows into the spaces 5 and, thereafter, is forcibly exhausted from the exhaust ports 6 via the exhaust passages 12 to the outside of the high-vacuum environment 7, under the influence of the suction pump 13.

As for the material of the fluid discharging portion 2, such a porous material that has a sufficiently small number of pores each having a sufficiently small size, is selected. Also, the vacuum pump 13 used in this embodiment has an exhaustion capacity (displacement) which is sufficiently large as compared with the air supply capacity of the pump 14. As a result, the pressure in the spaces 5 can be maintained sufficiently low. This effectively allows use of a magnetic fluid seal unit 8 to isolate the interior of the housing member 3 from the environment, as will be described later in more detail. Actually, experimental results show that, with the pressures of approx. several tens Torr in the spaces 5, the magnetic fluid seal units 8 satisfactorily seal the spaces 5 against the high-vacuum environment of the pressure of $10^{-5}$ to $10^{-8}$ Torr.

The bearing assembly of the present embodiment is provided with a pair of magnetic fluid seal units 8 which are disposed at the opposite sides of the fluid discharging portion 2, such as shown in FIG. 5. Since these seal units 8 are of the same structure, description will be made to one of them, more particularly the left-hand side one in FIG. 5. As shown in this Figure, the seal unit 8 includes a permanent magnet 8a, two pole pieces 8b, magnetic fluid sealing materials 8c, a retainer 8d and scrapers 8e. Each of the scrapers 8e is made of a resilient or elastic material and functions to scrape off the magnetic fluid 8c remaining on the surface of the shaft 1 when the bearing device moves axially relative to the shaft 1. In order to reduce the friction between the scraper 8e and the shaft 1, the tip end of the scraper 8e is formed into a knife edge shape. On the other hand, the shaft 1 has been subjected to surface treatment such as Teflon coating for the purpose of avoiding adhesion of the magnetic fluid.

Each of the magnetic fluid seal units 8 is coupled, by adhesion or the like, to a resilient member 9 which in turn is fixedly secured to the housing member 3 by means of fixing members 10a and 10b. The resilient member 9 used in this embodiment has stiffness or rigidity which is sufficiently less than that of the bearing device. As a result, the magnetic fluid sealing units 8 have a very little influence upon the moving accuracy of the bearing device. Therefore, high-precision feeding is assured.

FIG. 6 shows a second example of the bearing assembly. Like numerals in this Figure as those in FIG. 5 denote elements having similar to corresponding functions as of those in the FIG. 5 embodiment.

In the embodiment shown in FIG. 6, a fluid discharging portion 2 is made of such a porous material that has a further reduced number of pores each having a smaller size, as compared with those of the fluid discharging portion 2 of the FIG. 5 embodiment. Also, a vacuum pump 13 used in the present embodiment has a larger exhaustion capacity as compared with that of the pump 13 of the FIG. 5 embodiment. By this, a pressure near that of the high-vacuum embodiment 7 can be established in the spaces 5.

In the present embodiment, partition walls 15 each of an annular or ring shape are formed on the internal wall of the housing member 3. Each of these partition walls 5 is formed at a side of associated one of the exhaust ports 6, remote from the fluid discharging portion 2. Each of the partition walls 15 has an inner cylindrical surface which is spaced from the outer surface of the shaft 1 by a minute gap. In a case where the vacuum in the ambience 7 is not so high, the leakage of air from the bearing device is not a so serious problem, as compared with the case of the foregoing embodiment. In consideration of this, specific seal means such as the magnetic fluid seal unit in the foregoing embodiment is not provided between the shaft 1 and the housing member 3. Since the partition walls 14 are out of contact with the surface of the shaft 1 and since no specific seal means contacting the shaft 1 is used, the feeding accuracy of the bearing device of the present embodiment is completely free from the effect of the seal means. Therefore, relative movement at a very high feeding accuracy of the static pressure bearing is assured.

By use of the bearing assembly of the static pressure type described above, the position or orientation of the carriage CA can be controlled by adjusting the air pressure to be supplied and/or the air pressure to be exhausted. It is seen therefrom that any "yawing", "pitching", "rolling", etc. may advantageously be removed by use of this fine-moving means or, alternatively, by using the same in combintion with the above-described driving means PY, PZ, G$\theta$, etc.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for drawing a fine circuit pattern on a wafer, said apparatus comprising:
    a radiation beam generating head comprising means for generating and emitting radiation beams with which the wafer is to be exposed to draw a pattern thereon;
    first moving means for moving said beam generating head in a first direction; and
    second moving means for moving the wafer at least in a second direction, substantially perpendicular to said first direction, while holding the wafer by attraction.

2. An apparatus according to claim 1, wherein said first moving means includes a carriage for carrying thereon said beam generating head, and a driving element mounted on said carriage for finely moving said beam generating head.

3. An apparatus for drawing a fine circuit pattern on a wafer, said apparatus comprising:
    a radiation beam generating head comprising means for generating and emitting radiation beams with which the wafer is to be exposed to draw a pattern thereon;
    fine-driving means for finely moving said beam generating head in at least one of a Y-axis direction, a Z-axis direction and a $\theta$-direction; and
    control means operable to relatively align said beam generating head with the wafer.

4. A method of adjusting a positional relation between radiation beam generating means and a wafer which has an alignment mark and which is to be exposed with radiation beams generated by and emitted from the beam generating means to draw a pattern thereon, said method comprising the steps of:
    detecting the alignment mark formed on the wafer by use of a detecting element provided on the beam generating means as a unit; and
    moving the beam generating means in accordance with the detection performed in said detecting step so that a predetermined positional relation is established between the beam generating means and the wafer.

5. In a method of drawing a fine circuit pattern on a wafer by use of radiation beam generating means for generating and emitting radiation beams with which the wafer is to be exposed to draw a pattern thereon, the improved steps comprising:
reciprocatingly moving the beam generating means while in substantially opposed relation to the wafer; and
causing the beam generating means to generate and emit the radiation beams so as to expose the wafer to draw a pattern thereon, during the reciprocating movement of the beam generating means.

6. A radiation beam generating head assembly for generating and emitting radiation beams with which a wafer is to be exposed to draw a pattern therein, said beam generating head assembly comprising:
a base plate;
means provided on said base plate for generating and emitting the radiation beams;
means provided on said base plate for detecting a positional relation between said beam generating and emitting means and the wafer when the wafer is disposed in opposition to said beam generating and emitting means; and
a movable member for carrying said base plate for movement relative to the wafer.

7. A radiation beam generating head system according to claim 6, wherein said detecting means includes signal outputting means and signal inputting means which are cooperable to detect a mark formed on the wafer.

8. A radiation beam generating head system according to claim 6, wherein said radiation beam generating and emitting means includes a plurality of radiation beam sources each for generating and emitting a radiation beam.

9. A radiation beam head system according to claim 6, further comprising means for adjusting an orientation relative to said movable member of said beam generating and emitting means.

10. A radiation beam generating head system according to claim 6, wherein said movable member comprises a movable carriage.

* * * * *

UNITED STATES PATENT AND TRADEMARK OFFICE
CERTIFICATE OF CORRECTION

PATENT NO. : 4,810,889
DATED : March 7, 1989
INVENTOR(S) : TAKAO YOKOMATSU, ET AL.  Page 1 of 2

It is certified that error appears in the above-identified patent and that said Letters Patent is hereby corrected as shown below:

Title page:

IN [57] ABSTRACT

Line 4, "patternwisely" should read --patternwise--.

SHEET 5

FIG. 5, "VACCUM PUMP" should read --VACCUUM PUMP--.

SHEET 6

FIG. 6, "VACCUM PUMP" should read --VACCUUM PUMP--.

COLUMN 1

Line 15, "patterns" should read --pattern--.

COLUMN 2

Line 43, "disposed" should read --be disposed--.

COLUMN 3

Line 57, "move" should read --moved--.

UNITED STATES PATENT AND TRADEMARK OFFICE
CERTIFICATE OF CORRECTION

PATENT NO. : 4,810,889

DATED : March 7, 1989

INVENTOR(S) : TAKAO YOKOMATSU, ET AL.

It is certified that error appears in the above-identified patent and that said Letters Patent is hereby corrected as shown below:

COLUMN 7

Line 12, "wfer" should read --wafer--.

COLUMN 11

Line 17, "therein," should read --thereon,--.

Signed and Sealed this

Twentieth Day of February, 1990

Attest:

JEFFREY M. SAMUELS

Attesting Officer     Acting Commissioner of Patents and Trademarks